United States Patent
Okpotse et al.

(10) Patent No.: US 10,922,173 B2
(45) Date of Patent: Feb. 16, 2021

(54) FAULT-TOLERANT DISTRIBUTED DIGITAL STORAGE

(71) Applicant: Queen's University at Kingston, Kingston (CA)

(72) Inventors: Toritseju Okpotse, Kingston (CA); Shahram Yousefi, Scarborough (CA)

(73) Assignee: Queen's University at Kingston, Kingston (CA)

( * ) Notice: Subject to any disclaimer, the term of this patent is extended or adjusted under 35 U.S.C. 154(b) by 0 days.

(21) Appl. No.: 16/296,832

(22) Filed: Mar. 8, 2019

(65) Prior Publication Data

US 2019/0286521 A1 Sep. 19, 2019

Related U.S. Application Data

(60) Provisional application No. 62/642,070, filed on Mar. 13, 2018.

(51) Int. Cl.
*G06F 11/10* (2006.01)
*H03M 13/37* (2006.01)
*H03M 13/45* (2006.01)

(52) U.S. Cl.
CPC ....... *G06F 11/1076* (2013.01); *H03M 13/373* (2013.01); *H03M 13/3761* (2013.01); *H03M 13/458* (2013.01)

(58) Field of Classification Search
CPC ............. G06F 11/1076; H03M 13/373; H03M 13/3761; H03M 13/458
USPC .................... 714/764, 768, 769, 770, 773
See application file for complete search history.

(56) References Cited

U.S. PATENT DOCUMENTS

| | | |
|---|---|---|
| 8,386,840 B2 | 2/2013 | Stougie et al. |
| 9,419,749 B2 * | 8/2016 | Luby ................. H03M 13/3761 |
| 9,496,897 B1 | 11/2016 | Triandopoulos et al. |
| 2008/0320363 A1 | 12/2008 | He et al. |
| 2009/0044075 A1 * | 2/2009 | Read .................... G06F 11/1076 714/764 |
| 2012/0128009 A1 * | 5/2012 | Yang ................. H03M 13/2906 370/432 |
| 2014/0122441 A1 * | 5/2014 | Vervaet ............... G06F 11/1076 707/687 |
| 2015/0370677 A9 | 12/2015 | De Keyser et al. |

(Continued)

FOREIGN PATENT DOCUMENTS

WO WO2008/118168 A1 10/2008
WO WO2011/022555 A2 2/2011

OTHER PUBLICATIONS

Okpotse et al., Locality-aware fountain codes for massive distributed storage systems, 2015, IEEE, pp. 18-21. (Year: 2015).*

(Continued)

*Primary Examiner* — John J Tabone, Jr.
(74) *Attorney, Agent, or Firm* — Stephen J. Scribner

(57) ABSTRACT

Described are fountain code constructs that solve multiple problems in distributed storage systems by providing systematic encoding, reduced repair locality, reduced encoding/decoding complexity, and enhanced reliability. Embodiments are suitable for the storage of large files and exhibit performance superior to existing codes, and demonstrate reduced implementation complexity and enhanced symbol repair locality.

17 Claims, 6 Drawing Sheets

(56) References Cited

U.S. PATENT DOCUMENTS

2018/0018235 A1* 1/2018 Arslan .............. H03M 13/356

OTHER PUBLICATIONS

Yang et al., Implementation of Fountain Codes over Fading Channels, Nov. 1, 2006, IEEE, pp. 1-4. (Year: 2006).*
Mirrezaei et al., Towards Fountain Codes. Part II: Belief Propagation Decoding, Jun. 6, 2014, Springer Science+Business Media New York, pp. 1563-1584 (Year: 2014).*
Huang et al., Fountain Codes with Message Passing and Maximum Likelihood Decoding over Erasure Channels, 2011, IEEE, pp. 1-5. (Year: 2011).*
Uayb S. Arslan, ncremental Redundancy, Fountain Codes and Advanced Topics, Jul. 2014, Graph Codes and Their Applications, pp. 1-57. (Year: 2014).*
Gopalan, P. et al., "On the locality of codeword symbols", Information Theory, IEEE Transactions on, vol. 58, No. 11, pp. 6925-6934, (2012).
Asteris, M. et al., "Repairable fountain codes", Selected Areas in Communications, IEEE, vol. 32, No. 5, pp. 1037-1047, (2014).
Okpotse, T. et al., "Locality-aware fountain codes for massive distributed storage systems", In: Information Theory (CWIT), 2015 IEEE 14th Canadian Workshop on, pp. 18-21, (2015).
Sathiamoorthy, M., et al., "Xoring elephants: Novel erasure codes for big data", Proc. VLDB Endow., vol. 6, No. 5, pp. 325-336, (2013).
Huang, C. et al., "Erasure coding in windows azure storage", in Proc. of the 2012 USENIX Conference on Annual Technical Conference. Berkeley, CA, USA: USENIX Association, 2012, pp. 2-2.
Gummadi, R. et al., "Coding and scheduling in networks for erasures and broadcast", Ph.D. dissertation, Univ. of Illinois at Urbana-Champaign, Dec. 2011. [Online]. Available: http://hdl.handle.net/2142/29831.
Hyytia, E., et al., "Optimal degree distribution for LT Codes with Small Message Length", in IEEE INFOCOM 2007—26th IEEE International Conference on Computer Communications, pp. 2576-2580, (2007).
Shokrollahi, A., "Raptor codes", Information Theory, IEEE Transactions on, vol. 52, No. 6, pp. 2551-2567, (2006).
Khonsari, H. et al., "Analysis of ripple size evolution in the LT process", IET Communications vol. 12, No. 14, pp. 1686-1693, (2018).
Shokrollahi, A., "Mathknow: Mathematics, Applied Sciences and Real Life. Milano: Springer Milan, 2009, ch. Theory and applications of Raptor codes", pp. 59-89. [Online]. Available: http://dx.doi.org/10.1007/978-88-470-1122-9 5.

* cited by examiner

FAULT-TOLERANT DISTRIBUTED DIGITAL STORAGE

RELATED APPLICATION

This application claims the benefit of the filing date of Application No. 62/642,070, filed on 13 Mar. 2018, the contents of which are incorporated herein by reference in their entirety.

FIELD

This invention relates generally to distributed digital storage systems consisting of several disk drives providing fault-tolerant storage of electronic data, and more particularly, to distributed digital storage encoding and decoding constructs that prevent data loss and allow temporarily lost data to be easily regenerated.

BACKGROUND

The current high demand for massive-scale fault-tolerant storage systems is expected to continue over the next half decade as the information world experiences a data explosion. Major motivating factors for this expectation include the rise of computing trends such as cloud storage, and Storage as a Service (SaaS), as well as the rapidly expanding use of social media in various spheres of modern society. Regardless of the scale of implementation, data storage remains a core component of information systems; and data loss prevention is a critical requirement for storage systems.

Data loss in enterprise information systems could occur through different means including but not limited to unintentional actions such as; accidental deletion, malicious activity such as virus and malware attacks, mechanical damage to storage media, and even unforeseen natural disasters like flooding or earthquake. Data loss, whether reparable or not, usually results in service disruption which translates to massive financial losses, and in some cases, has led to termination of the businesses. In modern data storage systems, the deployed hard drives are usually considered unreliable and the general expectation is that such drives would eventually experience a failure that makes it impossible to read data stored over the drive.

To mitigate against permanent data loss, storage drive arrays are over-provisioned with redundant drives that are meant to guarantee a certain level of fault tolerance. A commonly used technique for providing fault tolerance is known as "triplication". Under this approach, the data on a storage drive can survive at most two drive failures when the original data is duplicated over a total of three different drives. The number of redundant drives is often refered to as storage overhead, and this is a frequently considered performance metric for fault-tolerance techniques.

In addition to basic reliability, fault-tolerance techniques for storage systems are also assessed on their repair performance after single drive failures. When a data storage drive becomes inaccessible, it is wise to recover the contents of the failed drive. This prevents a build-up of concurrent failures that could increase the possibility of permanent data loss. This recovery process is referred to as a "repair operation". It involves introducing a new storage drive to the system and transferring data from one or more working drives onto the new drive. The factors that determine how good a given technique performs with respect to repair, include; i) the number (repair locality) of hard drives contacted for the repair, as well as ii) the amount of repair data traffic (repair bandwidth) that traverses the network for a single repair.

Data triplication offers the best repair performance but very poor storage overhead which is easily seen as the storage system grows larger. The financial cost of redundant drives required to maintain desired level of reliability becomes very high. In addition, the administrative load is also quite tedious. As an alternative to triplication, erasure codes from the well-known class of Maximum Distance Separable (MDS) codes have been considered for fault-tolerance. These codes offer relatively improved performance with respect to storage overhead and system reliability as compared to triplication. Their shortcoming however, includes poor repair performance with respect to locality and bandwidth as well as a high complexity decoding process that would demand specialized processors [1].

Current research on fault-tolerant storage solutions using erasure codes is focused on reducing operational complexity, reducing storage overhead, and reducing repair locality. Of particular interest is the reduction of repair locality at a given desirable level of reliability. Reduced locality will provide both improved repair and permanent data loss prevention. The challenge in this regard is that reducing repair locality leads to increased storage overhead and vice-versa. Many recent techniques have tried to improve on the repair locality at the expense of higher storage overhead, however they also suffer from high operational complexity.

A number of techniques have been introduced recently to tackle some of these problems. Regenerating codes deal with the problem of minimizing the repair bandwidth by approaching it from a network coding perspective [1]. Most recently, Locally Repairable Codes and their variants have received significant research focus [2, 3]. These codes reduce the repair I/O cost by contacting fewer number of neighbor nodes during a repair operation. Contacting fewer nodes during repair addresses both the problem of high repair I/O and high repair bandwidth.

Given a linear (n,k) code with minimum distance d, a coded symbol is said to have repair locality r if upon its failure, it can be recovered by accessing only r other symbols [2]. Gopalan et al showed the trade-off between repair locality and minimum distance of a linear code using the bound $$d \leq n - k - \left\lceil \frac{k}{r} \right\rceil + 2.$$

The consequence of this inverse relationship is easily seen in recent locality-aware code designs which have slightly higher storage overhead.

In Windows Azure Storage [4], Local Reconstruction Codes (LRC) are designed by introducing an extra parity symbol to a (n=9, k=6) MDS code; thus enabling it to achieve a locality of r=k/2 In the same manner, Facebook's recently-implemented HDFS-Xorbas utilize Locally Repairable Codes (LRC) with k=10 source symbols and n−k=7 redundant symbols, constructed from a (k=10, n=14) Reed Solomon (RS) code [3]. This enables the system to achieve an information locality r=5. In addition, the above-cited codes still try to maintain a form of the "any k of n" MDS property, however, their increased storage overhead coupled with high encoding/decoding complexity reduces the attractiveness of such MDS property for distributed storage.

SUMMARY

Provided herein are methods and constructs for achieving fault-tolerant distributed data storage using erasure codes such as Fountain/Rateless codes. Relative to prior methods, the embodiments improve trade-offs between the achievable repair locality and the amount of encoded data in a given generation. Embodiments include methods and constructs for Fountain codes with low encoding and decoding complexity.

One aspect of the invention provides a method for improving reliability and/or optimizing fault tolerance of a distributed digital storage system comprising at least one processor and a plurality of digital storage devices, the method comprising: using the at least one processor to direct storing of a set of k source data symbols on the plurality of digital storage devices by: generating a plurality of encoding symbols from the set of k source data symbols using a Fountain encoder; determining a minimum locality of source data symbols; and reducing computational complexity during decoding by using a low complexity decoder; wherein the distributed digital storage system operates with improved reliability and/or optimized fault tolerance.

Another aspect of the invention provides programmed media for use with a distributed digital storage system comprising at least one processor and a plurality of digital storage devices, comprising: a code stored on non-transitory computer readable storage media compatible with the at least one processor, the code containing instructions to direct the at least one processor to store a set of k source data symbols on the plurality of digital storage devices by: generating a plurality of encoding symbols from the set of k source data symbols using a Fountain encoder; determining a minimum locality of source data symbols; and reducing computational complexity during decoding by using a low complexity decoder; wherein the distributed digital storage system operates with improved reliability and/or optimized fault tolerance.

Another aspect of the invention provides a distributed digital storage system comprising: at least one processor; a plurality of digital storage devices; and programmed non-transitory computer readable storage media as described herein.

In in one embodiment k is an integer greater than 1.

In one embodiment, generating the plurality of encoding symbols comprises systematic encoding via concatenation of original k source data symbols with a number of non-systematic symbols.

In one embodiment, each of the non-systematic symbols comprises a subset of d symbols selected uniformly at random from the source data set and the Fountain encoded symbol is calculated as an exclusive-or combination of the uniformly selected subset of d source data symbols.

In one embodiment, a Fountain erasure encoding algorithm uses a pre-determined distribution over an alphabet $1, \ldots, k$.

In one embodiment, the pre-determined distribution is such that d=1 has a probability of zero, and d=2, 3, ... k, have probabilities that are determined via a numerical optimization.

In one embodiment, the distribution for d=2, 3, . . . k, comprises a multi-objective optimization performed in the following steps: maximizing the probability of successful decoding; minimizing the average repair locality; and minimizing the average encoding/decoding complexity.

In one embodiment, average repair locality is determined via a Fountain code locality probability function.

In one embodiment, a repair locality of a source data symbol is defined as a least encoding degree of the source data symbol's output neighbors.

In one embodiment, the encoding yields a sparsely-connected bipartite graph.

In one embodiment, the low-complexity decoder is a Belief Propagation (BP) decoder over a binary erasure channel.

In one embodiment, the Fountain encoder comprises generating encoding symbols that are BP-decodable.

BRIEF DESCRIPTION OF THE DRAWINGS

For a greater understanding of the invention, and to show more clearly how it may be carried into effect, embodiments will be described, by way of example, with reference to the accompanying drawings, wherein.

DETAILED DESCRIPTION OF EMBODIMENTS

Figure 1:
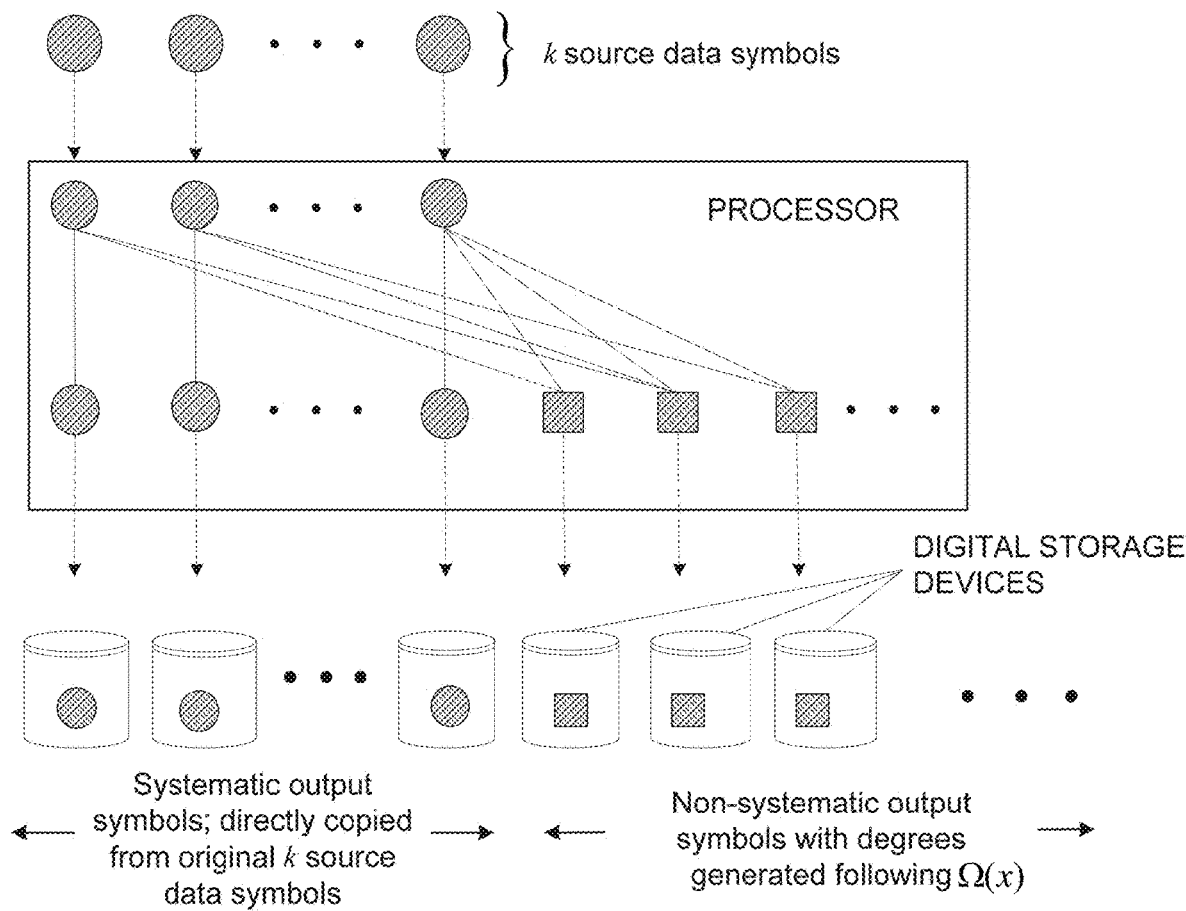
FIG. 1 is a diagram of a distributed digital storage system showing k source data symbols and encoded symbols above and beneath, respectively, where systematic encoding by a processor copies source nodes intact to the bottom, where they are stored on a plurality of digital storage devices. The $j^{th}$ non-systematic output node is constructed by uniformly sampling and linearly combining $d_j$ source nodes from the top.

Described herein are methods and programmed media for operating a distributed digital storage, comprising at least one processor and a plurality of digital storage devices. According to the embodiments, operating includes improving reliability and/or optimizing fault tolerance of distributed digital storage. Also described are distributed digital storage systems comprising at least one processor and a plurality of digital storage devices, including programmed media for operating the distributed digital storage with improved reliability and/or optimized fault tolerance.

To date, only a few works have considered the use of rateless codes to address the problems described above for distributed storage. Recently, the repair complexity of non-systematic LT/Raptor codes for distributed storage was analyzed [5], and a systematic version of LT codes achieving a trade-off between repair complexity and overhead was proposed. However, that analysis made little reference to repair locality as a performance measure. Following this, Repairable Fountain Codes were proposed [6] for distributed storage. In that proposal the locality is O(log k), and performance closely approaches that of an MDS code in the sense that it can be decoded from a random subset of $(1+\varepsilon)k$ coded symbols with high probability. However, the decoding used the computationally-expensive maximum-likelihood (ML) decoder which reduces its their attractiveness for implementation in production environments.

Compared to approaches currently in use, embodiments described herein improve and/or optimize distributed digital storage systems by providing one or more features such as, but not limited to, low repair-locality, systematic encoding, reduced encoding/decoding complexity, reduced overhead, and improved reliability. Certain embodiments use Fountain codes [7, 8] for distributed storage.

One aspect of the invention relates to rateless code embodiments that are capable of balancing between different storage system metrics based on user preference. To promote attractiveness for production implementation, the $O(k^3)$ cost of ML decoding is eliminated in the embodiments by using a sub-optimal Belief Propagation (BP) decoder. A ripple transition probability for finite-length rateless codes is used to formulate the probability that BP decoding fails. An expected number of steps the BP decoder will take before decoding terminates is then estimated. Code distribution coefficients are obtained using a multi-objective optimization procedure that achieves trade-offs between average locality, system reliability, and encoding/decoding complexity. At the cost of slightly higher storage overhead, the embodiments are more computationally efficient for implementation compared to existing erasure-coded storage techniques.

Embodiments may be constructed in any suitable code that can be executed by a processor associated with the distributed storage, for controlling operation of the distributed storage. Thus, embodiments may be implemented in any distributed storage system. The executable programmed instructions for directing the processor to implement embodiments of the invention may be implemented in one or more hardware modules and/or software modules resident in the processing system or elsewhere. In one embodiment the programmed instructions may be embodied on a non-transitory computer readable storage medium or product (e.g., a compact disk (CD), etc.) which may be used for transporting the programmed instructions to the memory of the data processing system and/or for executing the programmed instructions. In one embodiment the programmed instructions may be embedded in a computer-readable signal or signal-bearing medium (or product) that is uploaded to a network by a vendor or supplier of the programmed instructions, and this signal or signal-bearing medium may be downloaded through an interface to the data processing system from the network by end users or potential buyers.

1. Problem Statement

Let the data to be stored be broken down into a number of "generations" each with k input symbols $\{u_1, u_2, \ldots, u_k\}$, being elements from $F_q$—a finite field. A Fountain code over $F_q$ can be defined by its probability generating function $\Omega(x) = \sum_{d=1}^{k} \Omega_d x^d$, where $\Omega_d$ is the probability of generating an encoded symbol of degree d. With $\Omega(x)$, redundancy can be introduced into the system by generating n–k additional symbols (n>k), in order to achieve certain levels of fault tolerance for the source data.

The problem to be solved is that of determining an erasure code construction that not only provides fault tolerance but also meets the following design criteria:

Systematic encoding: the source symbols should be embedded in the encoded output symbols in their original form. Without this, every access/retrieval operation will require CPU-intensive decoding.

Low repair-locality: the number of symbols γ, contacted for repair of a single symbol in the event of a node failure should be such that γ<<k. Desirable range is a constant or logarithmic function of k.

Low encoding/decoding complexity: the time complexity as measured by number of operations required to encode/decode should be constant, linear or logarithmic function of k. Higher complexity implies more delays to complete read/write operations in addition to other computing functions being deprived of needed resources.

Low decoding overhead: for a system that requires n symbols in order to decode the original k source symbols, the desirable overhead is given by n–k=0.

Low storage overhead: the number of additional symbols beyond k that need to be stored in order to achieve a certain level of reliability.

For an approach based on rateless codes as described herein, the problem in simpler terms becomes; what are the probabilities $\Omega_1, \Omega_2, \ldots, \Omega_k$ satisfying the itemized requirements above?

Although previous work has tackled the original problem of designing erasure codes for fault tolerant distributed storage systems, no previous technique determines the probability distribution for a rateless code as a solution to the above listed problems. Designing a single code to provide all of these features is challenging due to the inverse relationship between some of them. The first item in the list above may be satisfied by performing a low-complexity systematic encoding as shown in the bipartite graph of FIG. 1, with source and encoded symbols above and beneath, respectively. The systematic encoding copies source nodes intact to the bottom. The $j^{th}$ non-systematic output node is constructed by uniformly sampling and linearly combining $d_j$ source nodes from the top. This appends the original source symbols $\{u_1, u_2, \ldots, u_k\}$ to the set of encoded symbols $\{u_1, u_2, \ldots, u_k, v_1 v_2, \ldots \}$. Satisfying the remaining features depends on the design of $\Omega(x)$. As noticed from LT codes and other examples of rateless codes, having different proportions of the k possible encoding degrees will satisfy some of these concerns while exacerbating others. Hence, these features are characterized analytically and then a multi-objective optimization (MOO) framework is used to strike a balance between conflicting metrics of interest.

2. Preliminary Considerations

Considering the encoding as suggested in FIG. 1, each source node is a member of α local groups where a local group is defined with repect to an encoded symbol $v_j$ as $\{v_j, u_i | v_j = \sum_i \beta_{ij} u_i, \beta_{ij} > 0, i \in \{1, \ldots, k\}\}$. Hence, a source node $u_i$ can contact any of its α local groups for repair upon failure. Now, let the number of encoded nodes generated be N and the average output node degree be given by μ, then α is $$Bi\left(N, \frac{\mu}{k}\right). \qquad [8]$$

Since the encoded nodes are not all the same degree, the repair-locality of a given source node is defined as the lowest degree among the set of output nodes it connects to [11]. Furthermore, failure of encoded nodes is not considered as these can be easily replaced by functional regeneration using the rateless encoder.

3. Probability Distribution for Repair Locality

At this point the locality distribution lemma from [11] is presented.

Lemma 1 Given a degree distribution $\{\Omega_1, \Omega_2, \ldots, \Omega_k\}$ where $\Omega_d$ is the probability of generating a degree d, the probability that an input node $u_1$ has locality $\gamma$ satisfies the expression $$p_\Gamma(\gamma) \leq C\left(1 - \frac{1}{k}\sum_{i<\gamma} i\Omega_i\right)^N \left(1 - \left(1 - \frac{\gamma\Omega_\gamma}{k}\right)^N\right) \quad (1)$$

where C is a normalization constant ensuring the probabilities satisfy $\Sigma_\gamma p_r(\gamma) = 1, \forall \gamma \in \{0, \ldots, k\}$.

A proof of this lemma which defines the relationship between the rateless code degree distribution coefficients and repair-locality is given in Appendix 1.

4. The Belief Propagation Decoder

Although the systematic nature of the code helps with easy symbol recovery, there may be cases of catastrophic failures where a full-scale decoding is needed. For these cases, BP decoding is performed and its performance is considered as a measure of system reliability.

The BP decoder operates in steps such that a single source symbol is recovered at each step and at the start of step L, (L−1) symbols have already been recovered. R(L)—the ripple at step L—is defined as the set of covered input symbols that are yet to be processed [7]. C(L)—the cloud at step L—is defined as the set of encoded symbols of reduced degree 2 or greater. The ripple size and cloud sizes at step L are dentoed by r(L) and $\Delta^L$ respectively. Furthermore, the set of reduced degree one output symbols at step L is denoted by P(L) While |P(L)| and the corresponding number of source symbols joining the ripple at step L are denoted by m and m' respectively. A succesful decoding using the Belief Propagation (BP) decoder is carried out in k steps where a source symbol is recovered at each step. Let $\Delta^0 = k(1+\varepsilon)$ be the number of symbols retrieved for decoding with $\varepsilon > 0$:
  i. Decoding starts with an initialization phase where all retrieved symbols with a single neighbor are released to cover their unique neighbor. The corresponding unique neighbors will form the ripple at initialization R(0).
  ii. The decoding then proceeds with the source symbol arbitrarily chosen from the ripple at the start of that step getting processed and ultimately recovered. Thus at step L, (L−1) source symbols have been recovered and the $L^{th}$ symbol is being processed for recovery.
  iii. The processing of the $L^{th}$ source symbol leads to pruning of edges in the decoding graph and possibly the release of output symbols. The size of the ripple may or may not change depending on the number of released non-redundant output symbols.
  iv. The $L^{th}$ source symbol is recovered and removed from the graph at the end of its processing. If L<k and |R(L)|>0, decoding continues by repeating the process from step ii above, where a new symbol is chosen for processing. If |R(L)|=0 at step L<k, decoding terminates unsuccessfully, otherwise, if L=k, the decoding is declared successful.

5. Ripple Size Analysis 5.1. Ripple Transition Probability

Using the definitions and notation from the previous section, a parameter of the BP decoder—the ripple size—was examined. The importance of the ripple size has been highlighted in previous works, and it has been shown that its behaviour during decoding is largely determined by the degree distribution [7, 12]. Thus, a degree distribution that favours good decodability would ensure the ripple size does not go to zero till decoding is completed. To facilitate such a degree distribution design, the ripple release probability (proposition 7) of [7] was derived in lemma 2 of [12]. Extending that analysis, the probability that a released output symbol is redundant, i.e., it does not contribute to an increase of the ripple size, was formulated with the objective of finding a suitable ripple evolution. Based on this, a one-dimensional random walk process was used to model the ripple behaviour as [8]:

$$r(L) = \begin{cases} r(L-1) + 1, & w.prob.\, 0.5 \\ r(L-1) - 1, & w.prob.\, 0.5 \end{cases} \quad (2)$$

Sorensen et al. proceeded to factor in the bias of the ripple size towards zero and arrived at the following random walk model for the ripple size behaviour [12]:

$$r(L) = \begin{cases} r(L-1) + 1, & w.prob.\, 0.5(1 - p'_r)^2 \\ r(L-1), & w.prob.\, p'_r(1 - p'_r) \\ r(L-1) - 1, & w.prob.\, 0.5 + 0.5 p'^2_r \end{cases} \quad (3)$$

where the quantity $p'_r$ represents the probability that a released output symbol is redundant.

Figure 2:
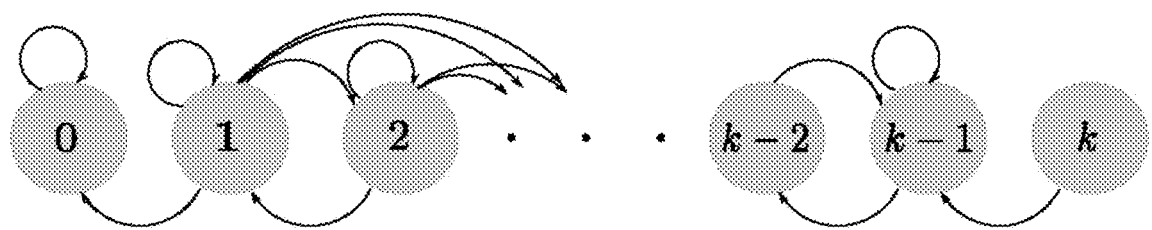
FIG. 2 is a diagram showing possible ripple size transitions with a reflecting barrier at r(L)=k and an absorbing barrier at r(L)=0.

In [8] it was pointed out that the ripple size behaviour during decoding is similar to that of a biased 1-D random walk over the finite interval [0, k], with an absorbing barrier at 0 and a reflecting barrier at k similar to FIG. 2. The model considers the addition of only 0, 1 or 2 symbols at a decoding step.

However, in accordance with the invention, the maximum number of symbols possible in the ripple at step L is (k−L). In other words, the number of new symbols that could join the ripple upon recovery of the $L^{th}$ symbol is not upper-bounded by 2, but by k−(L−1)−r(L−1). Embodiments avoid possible inaccuracies from approximate models by implementing a ripple transition that takes into account all possible states at any given decoding step. Hence, the ripple size at the end of decoding step L is given by $$r(L) = r(L-1) - 1 + m'$$

where, m' is the number of source symbols that joined the ripple due to processing of the $L^{th}$ source symbol and 1 is subtracted to account for the $L^{th}$ symbol currently being processed. The corresponding ripple transition probability is given by the following theorem as derived in [9].

Theorem 1 Consider the BP decoding process as described above. The transition probability of the ripple size at the $L^{th}$ decoding step is given by:

$$P(r(L) \mid r(L-1), \Delta^L) = \sum_{mMin}^{mMax} g(m', m, r(L-1), L) P(|P(L)| = m) \quad (4)$$

where, r(L−1), r(L) represent the ripple sizes in the $(L-1)^{th}$ and $L^{th}$ decoding steps respectively, $\Delta^L$ is the number of symbols available for decoding at step L. Also, $m_{Min} = m'$, and $$m_{\text{Max}} = \Delta^L = \Delta - \sum_{l=0}^{L-1} |P(l)|.$$

The terms g(m', m, r(L−1), L) and P(|P(L)|=m) are computed as:

$$g(m', m, r(L-1), L) \triangleq P(m' \mid m, r(L-1)) = \sum_{q=m'}^{\min(k-L, m'+r(L-1)-1)} \frac{\binom{r(L-1)-1}{q-m'}\binom{k-(L-1)-r(L-1)}{m'}z_q(m)}{(k-L)^m} \quad (5)$$

$$P(|P(L)| = m) = \binom{\Delta^L}{m} P_y^m (1-P_y)^{\Delta^L - m} \quad (6)$$

In (6), $$z_q(j) = \sum_{p=0}^{q} \binom{q}{p}(q-p)^j (-1)^p \quad (7)$$

is the number of 1-to-1 mappings between the set of j reduced degree one symbols and the set of q source symbols they are connected to. Then $$P_y = \frac{\sum_{d=2}^{k} \lambda_d \frac{\binom{L-1}{d-2}\binom{l}{1}\binom{k-L}{1}}{\binom{k}{d}}}{1 - \sum_{d=1}^{L} \lambda_d \sum_{i=0}^{1} \frac{\binom{L-1}{d-i}\binom{k-(L-1)}{i}}{\binom{k}{d}}} \quad (8)$$

is the probability that an output symbol becomes reduced degree one at step L conditioned on its being in the cloud before step L [10].

A proof of theorem 1 can be found in [9].

5.2. Marginalization over Number of Symbols in Cloud

The denominator of $P_y$ in (1) is actually the probability that a given output symbol is in the cloud at step L, which is calculated as the complement of the probability that the symbol is originally of degree d and it has at most one of its neighboring source symbols unrecovered. Let this probability be denoted by $P_c$, then the distribution of $\Delta^L$ is binomial $B(\Delta^0, P_c)$.

This allows us to marginalize the ripple transition probability over the random variable $\Delta^L$. Thus, rewriting (1) gives $$P(r(L) \mid r(L-1)) = \sum_{\delta=m'}^{\Delta^0} P((r(L) \mid r(L-1)), \Delta^L) \quad (9)$$

6. Decoder Failure Probability Analysis

In this section it is shown how (1) can be used to determine the probability that decoding fails before all symbols are recovered.

6.1 Probability of Ripple Size at Step L

Given the ripple transition probability in (1), a forward equation is defined to estimate the probabilities for future ripple sizes using general formulations similar to those from random walk theory over an arbitrary lattice [13].

Definition 1: Define the future ripple size probability $P_L^{FS}(s \mid s_0)$ as the probability that the ripple size equals s after L decoding steps, given that the starting value was $s_0$.

As expected, $P_L^{FS}((s \mid s_0)$ should satisfy the following conditions;

$$\sum_s P_L^{FS}(s \mid s_0) = 1$$

$$P_0^{FS}(s \mid s_0) = \begin{cases} 1, & s = s_0 \\ 0, & \text{otherwise} \end{cases}$$

Now the following forward equation can be defined for the future ripple size probability at step L given the ripple size at initialization $$P_L^{FS}(s \mid s_0) = \sum_{j=1}^{L} F_j(s \mid s_0) P_{L-j}^{FS}(s \mid s) \quad (8)$$

where $F_j(s \mid s_0)$ is the probability that the ripple size equals s for the first time at decoding step j given that the starting value was $s_0$.

6.2 Decoder Failure Probability and Expected Number of Steps to Decoding Termination From $P_L^{FS}(s \mid s_0)$, compute the probability that decoding terminates at some step L=T for T<k, and s=0, as $$P_T^{FS}(0 \mid s_0) = \sum_{j=1}^{L} F_j(0 \mid s_0) P_{L-j}^{FS}(0 \mid 0)$$

$$= F_T(0 \mid s_0) P_0^{FS}(0 \mid 0)$$

$$= F_T(0 \mid s_0).$$

This is due to the fact that $P_0^{FS}(0 \mid 0) = 1$ by definition, and $P_L^{FS}(0 \mid 0)$ is an impossible event since the random walk goes into an absorbing state for s=0. Consequently, the BP decoder failure probability is given by $$P_T^{FS}(0 \mid s_0) = F_T(0 \mid s_0)$$

$$= p_{L-1,L}(0 \mid 1) P_{L-1}^{FS}(1 \mid s_0)$$

And the overall probability that the decoder fails to retrieve all k source symbols $$P_{\text{fail}} = \sum_{T=1}^{k-1} P_T^{FS}(0 \mid s_0)$$

The reasoning behind this is that the ripple state of 0 is an absorbing state which represents termination of decoding. Hence a ripple size of zero can only be encountered once in a single decoding attempt. On the other hand, all other ripple size values between 1 and (k−1) can occur multiple times. For example, if r(0)=k−1, and while recovering the first symbol at step 1 a new symbol is added to the ripple, then, r(1) will also be k−1. In fact, for s=1,2, . . . , k, (4) can be expressed in terms of a so-called first passage distribution that takes into account all the possibilities of a given ripple size occuring multiple times [13]. However, such-analysis is not relevant to the current discussion so it is not covered here.

Clearly, $P_T^{FS}(0|s_0)$ is also the probability that the decoding runs for exactly T steps. Thus for a given code length, output degree distribution and number of symbols retrieved for decoding, the expected number of steps the decoder takes before termination can be determined as:

$$E(T) = \sum_{t=1}^{k} t \cdot Pr(T=t) \qquad (11)$$
$$= \sum_{t=1}^{k} t P_t^{FS}(0)$$

where $P_t^{FS}(0)$ is the marginal probability, $$P_t^{FS}(0) = \sum_{s_0} P_t^{FS}(0|s_0) Pr(s_0)$$

6.3 Probability of Initial Ripple Size

In the analysis r(0) is the size of the ripple at initialization. If r(0)=0, then decoding terminates with no symbol being recovered. In this scenario, there are two sources from which the ripple at initialization can be populated. Firstly, having $\Omega_1 > 0$ in the encoding degree distribution ensures that with probability $\Omega_1$, output nodes of degree 1 will be generated. Simple probability analysis reveals that with probability $\Omega_1 N(1+\varepsilon)/(k+N)$, a fixed source symbol connected to a degree 1 encoded symbol becomes a candidate for the initial ripple. Secondly, when $k(1+\varepsilon)$ symbols are selected for decoding from the set of k source and N encoded symbols, originally-systematic symbols are also selected and can join R(0). Basic counting arguments show that if symbols are selected uniformly at random for decoding and in the absence of any erasures, a fixed source symbol becomes a candidate for the ripple with probability $$\frac{\binom{k+N-1}{k(1+\varepsilon)-1}}{\binom{k+N}{k(1+\varepsilon)}}$$

To reduce the impact of excessive low-degree symbols on decodability, the systematic structure of the code is exploited in not generating more degree 1 output symbols by setting $\Omega_1$ to zero. Consequently, R(0) holds only systematic symbols that have been retrieved for decoding. In this case, r(0)=|R(0)| can simply be calculated as the hypergeometric random variable $\Theta$ with PMF $$p_\Theta(\theta) = \frac{\binom{k}{\theta}\binom{N}{k(1+\varepsilon)-\theta}}{\binom{k+N}{k(1+\varepsilon)}}$$

over the alphabet $\{0, 1, 2, \ldots, k\}$

7. Optimization Procedure and Outcome

This section presents and discusses the results obtained from a numerical optimization for the degree distribution coefficients in addition to the decoding performance under varying decoding overhead and failure probability conditions. The goal is to find the coefficients $0 \le \Omega_d \le 1$, that jointly satisfy locality, reliability and complexity using a hierarchical MOO strategy [14]. First, the coefficients that tackle complexity by minimizing the average degree are found, $E(\Omega(d))$, i.e., $$\begin{aligned}&\underset{\Omega_1, \Omega_2, \ldots, \Omega_k}{\text{minimize}} E(\Omega(d)) \\ &\text{s.t.} \quad 0 \le \Omega_d \le 1, d = 1, 2, \ldots, k \\ &\sum_{d=1}^{k} \Omega_d = 1\end{aligned} \qquad (12)$$

and hence obtain the optimal objective value $f^*$ for (12). Now, let $\varepsilon_1$ be the allowable distance from optimality that is permitted, then the average locality is minimized using $f^*$ as an additional constraint;

$$\begin{aligned}&\underset{\Omega_1, \Omega_2, \ldots, \Omega_k}{\text{minimize}} E(\Gamma) \\ &\text{s.t.} \quad 0 \le \Omega_d \le 1, d = 1, 2, \ldots, k \\ &\sum_{d=1}^{k} \Omega_d = 1 \\ &E(\Omega(d)) \le f^* + \varepsilon_1\end{aligned} \qquad (13)$$

Lastly, the expected number of steps taken by the decoder is maximixed subject to the bound and probability sum constraints. In addition, let $g^*$ be the optimal average locality value from (13), and let $\varepsilon_2$ be the allowable deviation from $g^*$ then solve the problem $$\begin{aligned}&\underset{\Omega_1, \Omega_2, \ldots, \Omega_k}{\text{maximize}} E(T) \\ &\text{s.t.} \quad 0 \le \Omega_d \le 1, d = 1, 2, \ldots, k \\ &\sum_{d=1}^{k} \Omega_d = 1 \\ &E(\Gamma) \le g^* + \varepsilon_2\end{aligned} \qquad (14)$$

To reduce the dimensionality and hence complexity of the optimization problem, it is assumed that not all encoding degrees $d \in \{1, \ldots, k\}$ are required to have a non-zero probability of selection [15, 16]. This multi-objective optimization strategy offers flexibility for the system designer as they can vary the parameters $\varepsilon_1$ and $\varepsilon_2$ to obtain a distribution that gives preference to any of the objective functions. For example, setting $\varepsilon_1$ quite low indicates a preference for minimal complexity above the other two objectives, thus the distribution obtained will have the majority of the probability mass on the low degrees. A similar output will be observed for low $\varepsilon_2$ since lots of low degrees is essential for good locality. On the other hand, good decodability requires high degrees to provide adequate symbol coverage in the encoded system. Thus, a degree distribution that provides good system reliability particularly for a systematic code, should have a fair proportion of the probability mass on the higher degrees. A weighted sum method [17] is not used for this multi-objective optimization mostly because determining the weights such that they accurately satisfy each objective function is not a trivial task.

TABLE 1

Degree Distributions for k = 30, 50, & 100

| | | $\Omega_d$ | |
|---|---|---|---|
| d | k = 30 | k = 50 | k = 100 |
| 1 | — | — | — |
| 2 | 0.14519 | 0.12355 | 0.04979 |
| 3 | 0.13120 | 0.11411 | 0.08503 |
| 4 | 0.09646 | 0.11242 | 0.13962 |
| 5 | 0.09347 | 0.10671 | 0.06409 |
| 8 | 0.09723 | 0.09947 | 0.06519 |
| 9 | — | — | — |
| 10 | 0.10167 | — | — |
| 11 | — | 0.10032 | 0.12196 |
| 12 | — | — | — |
| 13 | 0.09412 | 0.09068 | 0.13497 |
| 18 | 0.11789 | — | — |
| 19 | — | 0.07292 | 0.03132 |
| 22 | 0.03822 | — | — |
| 24 | — | 0.05260 | 0.04508 |
| 27 | 0.08457 | — | — |
| 31 | — | 0.03891 | 0.06486 |
| 37 | — | 0.02189 | 0.07514 |
| 45 | — | 0.06643 | 0.03806 |
| 46 | — | — | 0.08489 |
| $\varepsilon_1/\varepsilon_2$ | 8/6 | 10.5/8 | 15/5 |
| $\mu$ | 9.80 | 11.36 | 15.45 |
| $E(\Gamma)$ | 4.39 | 4.59 | 5.49 |

The degree distributions obtained for k=30, 50 and 100 and our choices of parameters $\varepsilon_1$ and $\varepsilon_2$ are shown in Table 1. $\Omega_1$ is explicitly set to zero for all values of k as discussed in section 6.3. The achieved average degree and average locality values are also shown. The probabilities in Table 1, show a deviation from the soliton-like distribution pattern [15]. The highest probability mass does not necessarily belong to degree 2 and the mass distribution is almost evenly spread among the lower degrees. One reason for this is the systematic nature of the code which produces an abundance of degree 1 symbols. Intuitively, having a high proportion of degree 2 would make full decoding (system reliability) come with high decoding overhead due to expected poor symbol coverage. It is obvious though, that most of the probability mass goes to the lower degrees, thus underscoring the usefulness of low degrees for all three metrics considered.

8. Performance Comparison and Results Summary

Figure 3A:
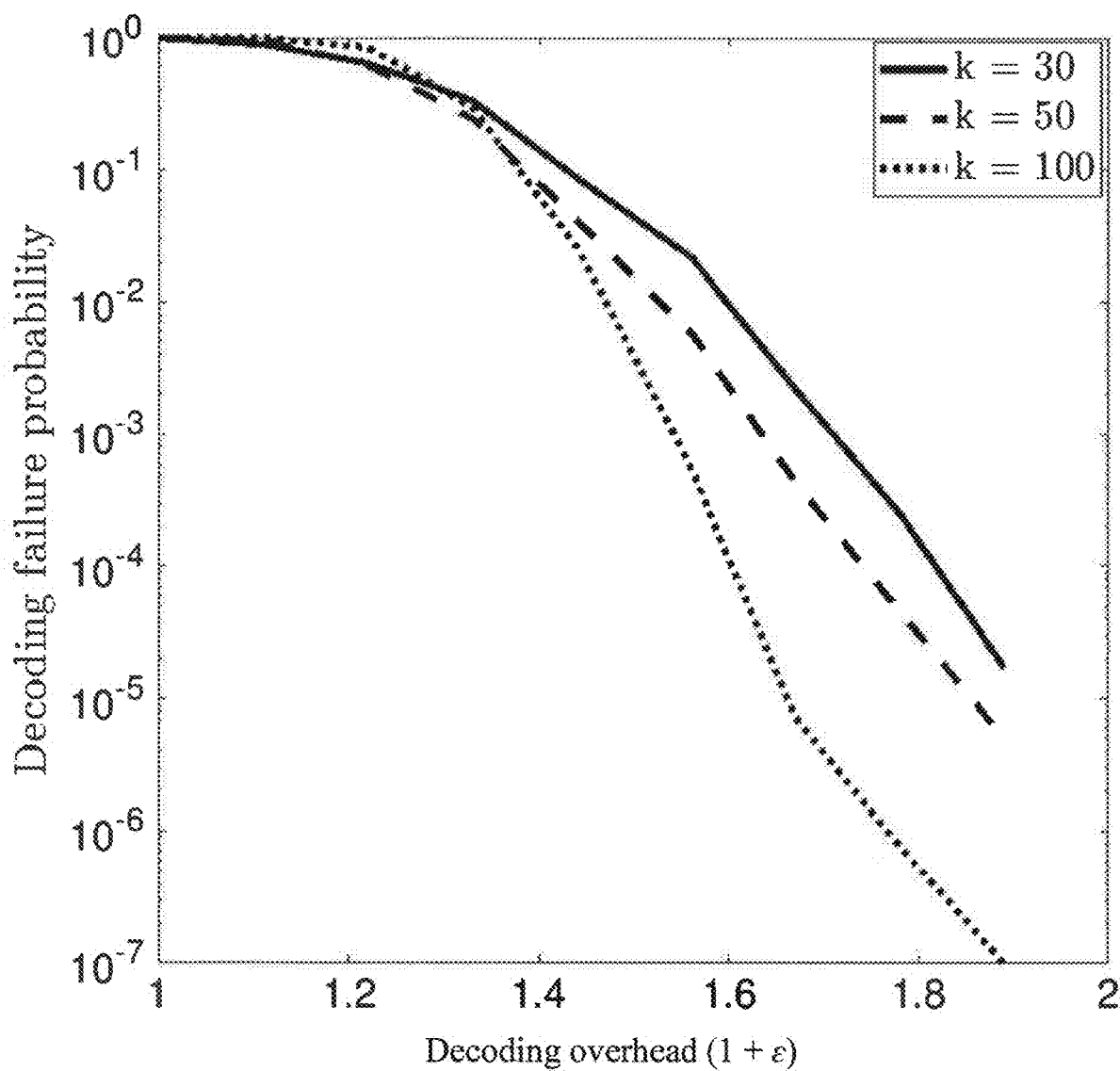
FIGS. 3A and 3B are plots showing probability of decoding failure versus (3A) increasing decoding overhead, and (3B) increasing node failure probability, for different values of k, according to a simulation using k input symbols and N=k encoded symbols for a rate of ½, and the degree distribution shown in Table 1.
Figure 3B:
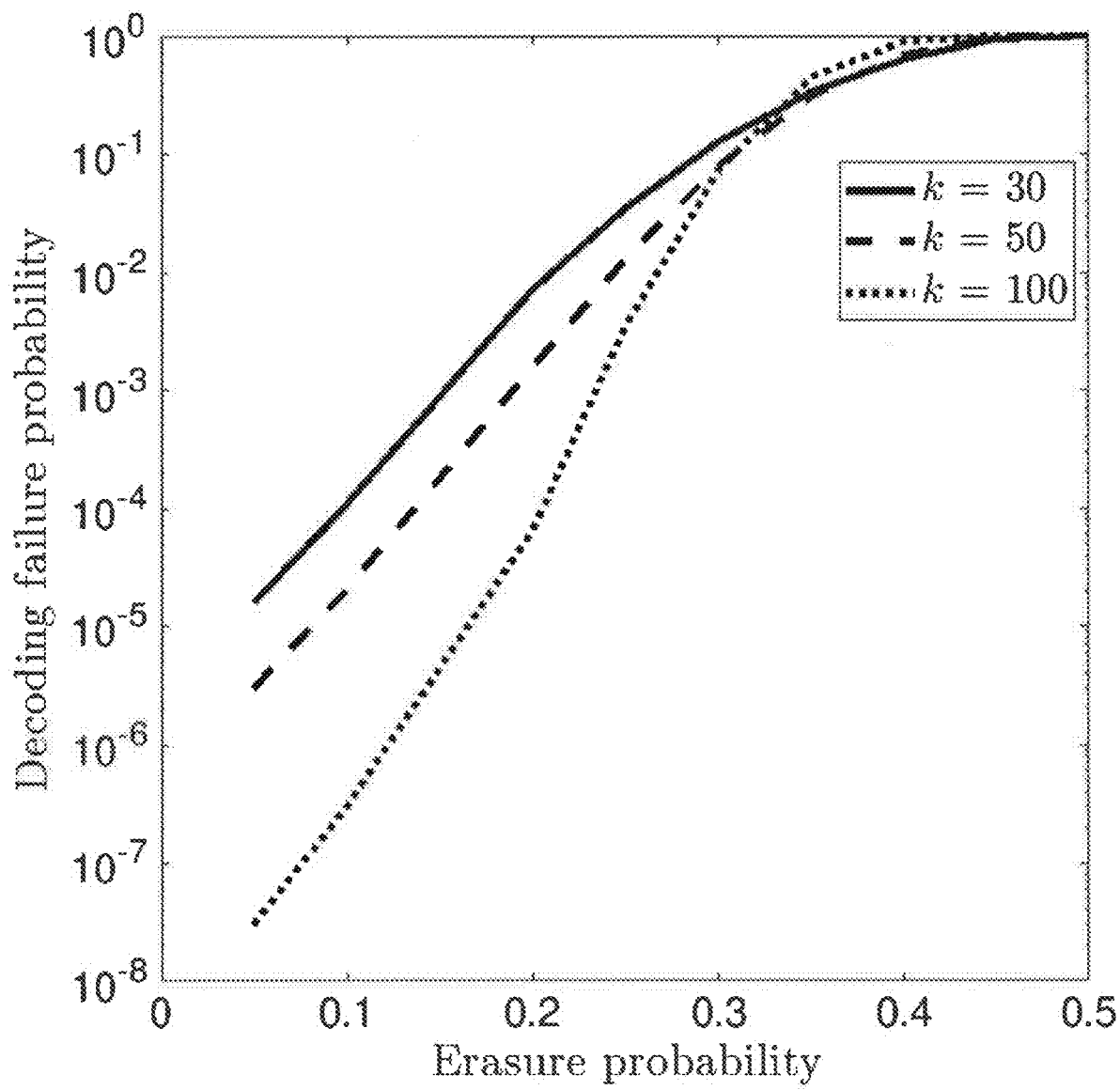

With the values from Table 1, a Monte Carlo simulation was run to experimentally evaluate the decoding performance of the codes. The plots in FIGS. 3A and 3B show the probability of decoding failure versus overhead ($\varepsilon$) and node erasure probability, respectively. The simulated system was set to operate with k source symbols and N=k ratelessly encoded symbols. From the plots, it is seen that successful recovery of all k symbols is hardest at lower overhead which also corresponds to high erasure probability. A possible explanation for this behaviour is the abundance of degree 1 symbols in the system. As the overhead increases, decoding performance improves.

Figure 4A:
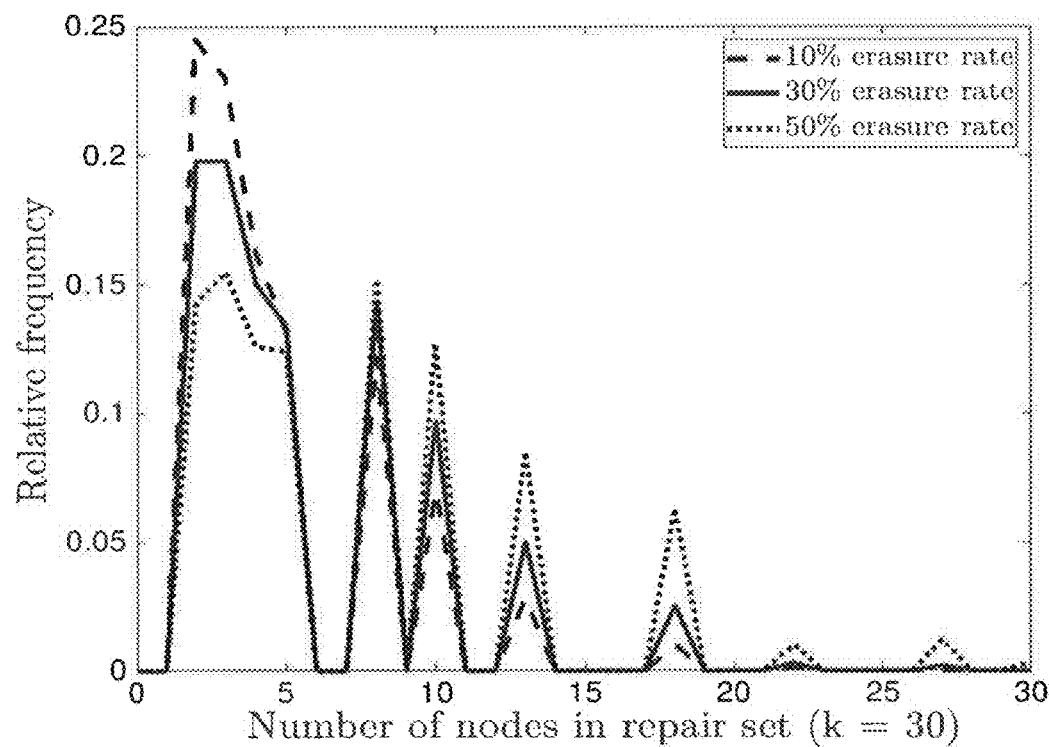
FIGS. 4A-4C show experimental probability (Monte Carlo) plots for number of symbols in a repair set at 10%, 30%, 50% symbol erasure rates and k=30, 50, and 100, respectively.
Figure 4B:
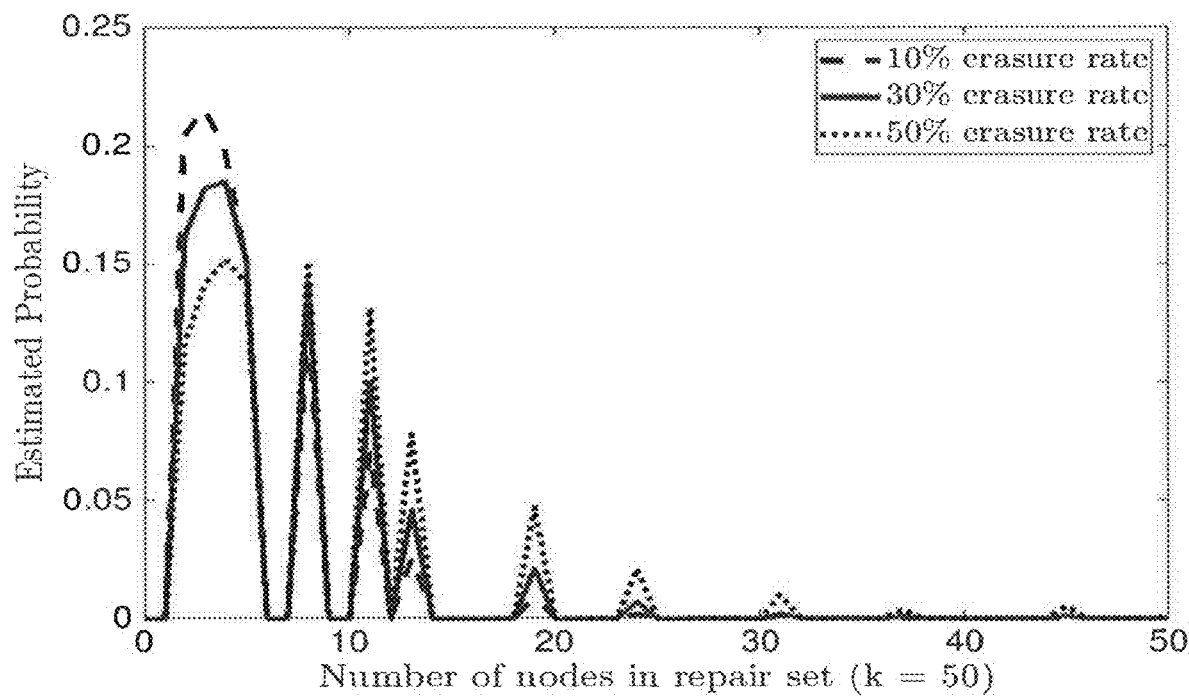
Figure 4C:
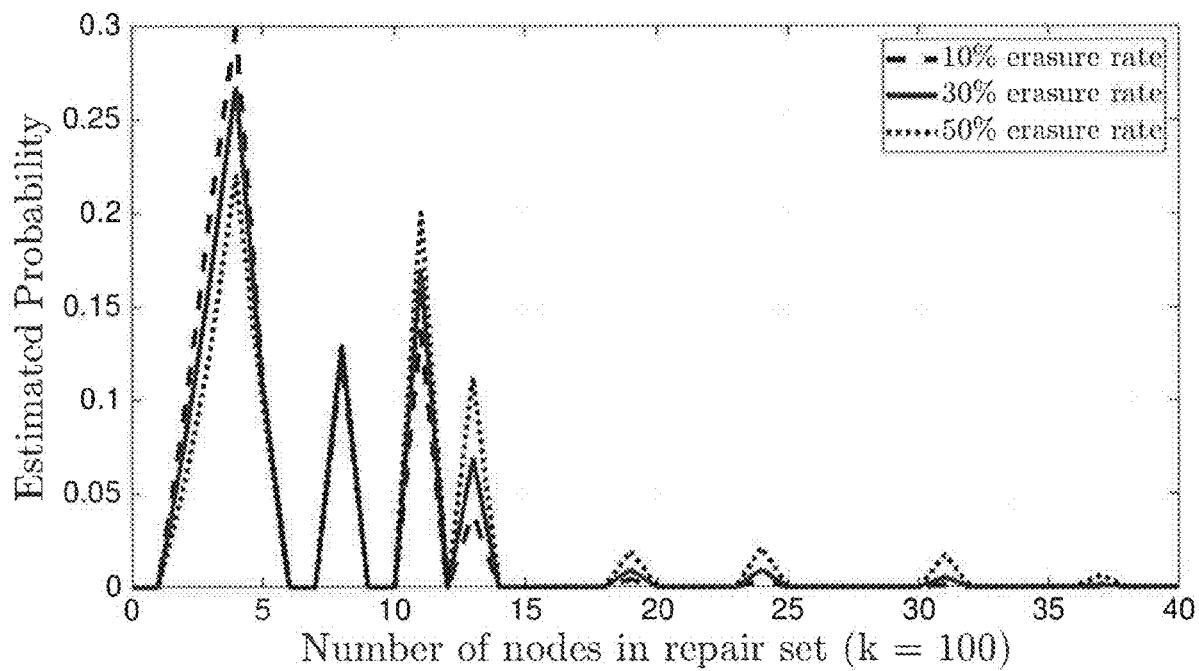

A different set of Monte Carlo experiments was also performed to observe the actual number of nodes contacted for repair of a single failed node. The plots in FIGS. 4A, 4B and 4C show the results for k=30, 50, and 100, respectively. In this analysis, the rate ½ encoded system was subjected to random erasures of 10%, 30%, and 50% and an attempt to repair (in the case that it experienced a failure) the chosen symbol from its neighboring local groups was made. As mentioned above, when the observed node experiences an erasure, we contact the local group with the fewest number of unerased nodes for repair. When none of its local groups are available for repair, the maximum I/O cost of k is assumed. The peaks in the figures correspond to non-zero values of the corresponding degree distribution and the three figures show that up to 90% of the time, less than k symbols were contacted for the repair operation. They also show that with fewer erasures, the failed symbol is more likely to be repaired with lower I/O cost. For performance with respect to k, it is seen that the relative repair cost reduces as k increases.

8.1 Performance Comparison

The following is a performance analysis discussion of some recent codes for distributed storage and the embodiments decribed herein based on the multi-objective optimization technique. Although a large number of coding techniques have been described, the analysis is restricted to a small subset of prior techniques which have either been deployed or tested in production environments. The only exclusion to this restriction is Repairable Fountain Codes (RFC), which have neither been tested nor deployed for production use but are the only known rateless codes designed for efficient repairability. Furthermore, the replication technique is not discussed, but is still being implemented despite its storage overhead cost. For brevity, multi-objective optimized fountain code is referred to as MOO-FC, while the prior coding techniques considered include the following:

1. HDFS-Reed Solomon code with parameters (n=14, k=10). Designed for use in Facebook implementation of the Hadoop distributed filesystem. Will be referred to as HDFS-14-10.
2. HDFS-Reed Solomon code with parameters (n=16, k=10). Locally repairable code also designed for use in Facebook implementation of the Hadoop distributed filesystem. Will be referred to as LRC-Xorbas.
3. Locally repairable code designed for/deployed in the Windows Azure Storage Cloud platform with parameters (n=10,k=6) and will be referred to as LRC-WAS.
4. Repairable Fountain Codes. Will be referred to as RFC The analysis is carried out by considering the design criteria stated in Section 1.

8.1.1 Locality (Repair I/O Cost)

Figure 5:
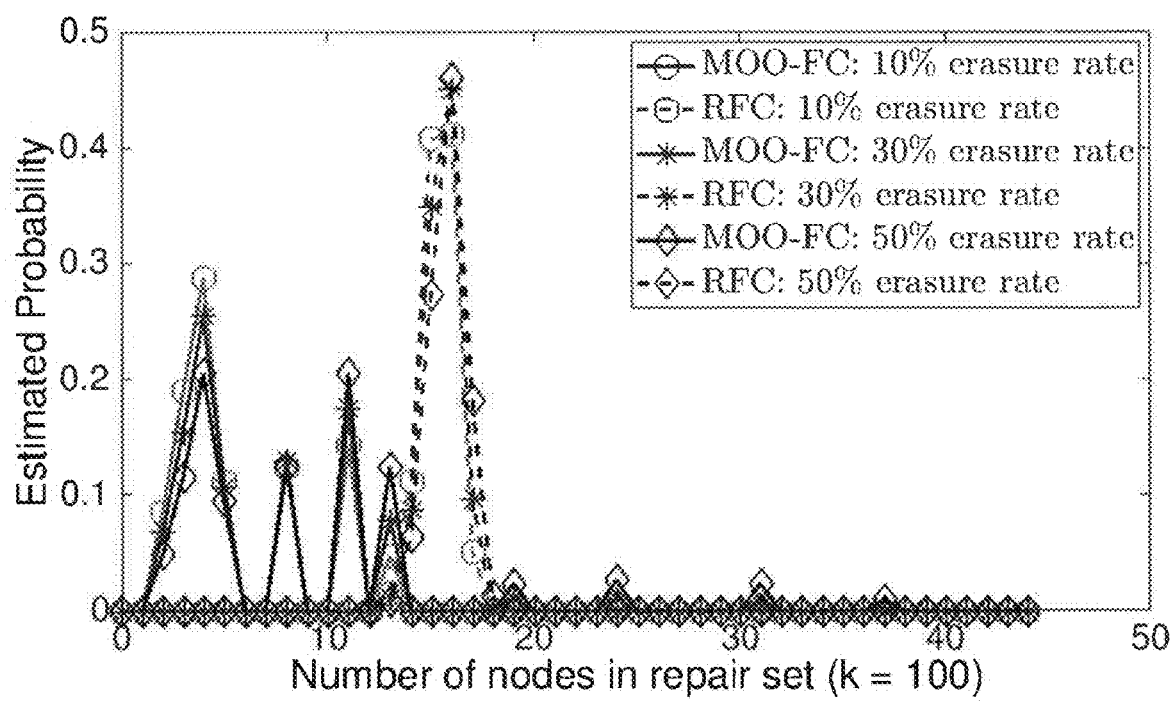
FIG. 5 is a plot showing a comparison between. RFC and MOO-FC for number of symbols in repair set at 10%, 30%, 50% symbol erasure rates with k=100; for RFC, c=4 .

MDS codes like HDFS-14-10 exhibit the highest repair cost by contacting k nodes for the recovery of a single failed node. Between these two extremes, there are codes specifically designed to achieve a certain locality. LRC-Xorbas and LRC-WAS achieve locality of 0.5k and 0.6k, respectively. Until now, RFC is the only other known locality-aware code based on Fountain codes. They are capable of achieving locality logarithmic in k. This is possible since the encoding degree of each output node is at most $\lceil c \log(k) \rceil$, c>0 (by virtue of selecting symbols with replacement). A quick analysis shows that the expected number of unique symbols chosen when d symbols are selected with replacement from the set $\{u_0, u_1, \ldots, u_{k-1}\}$ is $k(1-(1-1/k)^d)$. This is still quite close to the theoretical locality of $\lceil c \log(k) \rceil$ for the values of k and c considered as seen from a repeat of the experiment previously performed to observe repair performance (FIG. 5). In FIG. 5 a comparison between RFC and MOO-FC is shown for number of symbols in repair set at 10%, 30%, 50% symbol erasure rates with k=100. For RFC, set c=4 Comparing the performance of MOO-FC and RFC, it is seen that even at the maximum failure probability of 0.5 , MOO-FC is capable of repairing the failed symbol with lower I/O cost than RFC. This advantage stems from the selected combination of low and high encoded symbol degrees present in MOO-FC but lacking in RFC.

8.1.2 Complexity

Here, only the complexity of encoding and decoding associated with these techniques is considered.

The encoding cost of these techniques depends on the number of operations required to generate a single symbol. For the same input length k, MDS codes like HDFS-14-10, LRC-Xorbas and LRC-WAS which require all symbols participating in the generation of a single encoded symbol have a higher encoding cost than RFC and MOO-FC. The sparsity of RFC and MOO-FC keeps their encoding cost linear in k. The output node degree for RFC ($\lceil c \log(k) \rceil$) increases with the parameter c. For parameters c=4 and 6, the output node degree is slightly greater than the average encoding degree of MOO-FC given in Table 2. Hence, MOO-FC will have a slightly lower encoding cost than RFC.

With regard to decoding cost, MOO-FC has the least decoding cost since all the other codes are decoded using the ML decoder with complexity $O(k^3)$. For the message passing BP decoder used by MOO-FC, inexpensive XOR operations help reduce the decoding complexity per symbol. The overall complexity is tied to the number of edges in the decoding graph, which depends on the average output symbol degree, and which can be seen to be minimal for the values of k considered.

8.1.3 Decoding Overhead

Figure 6:
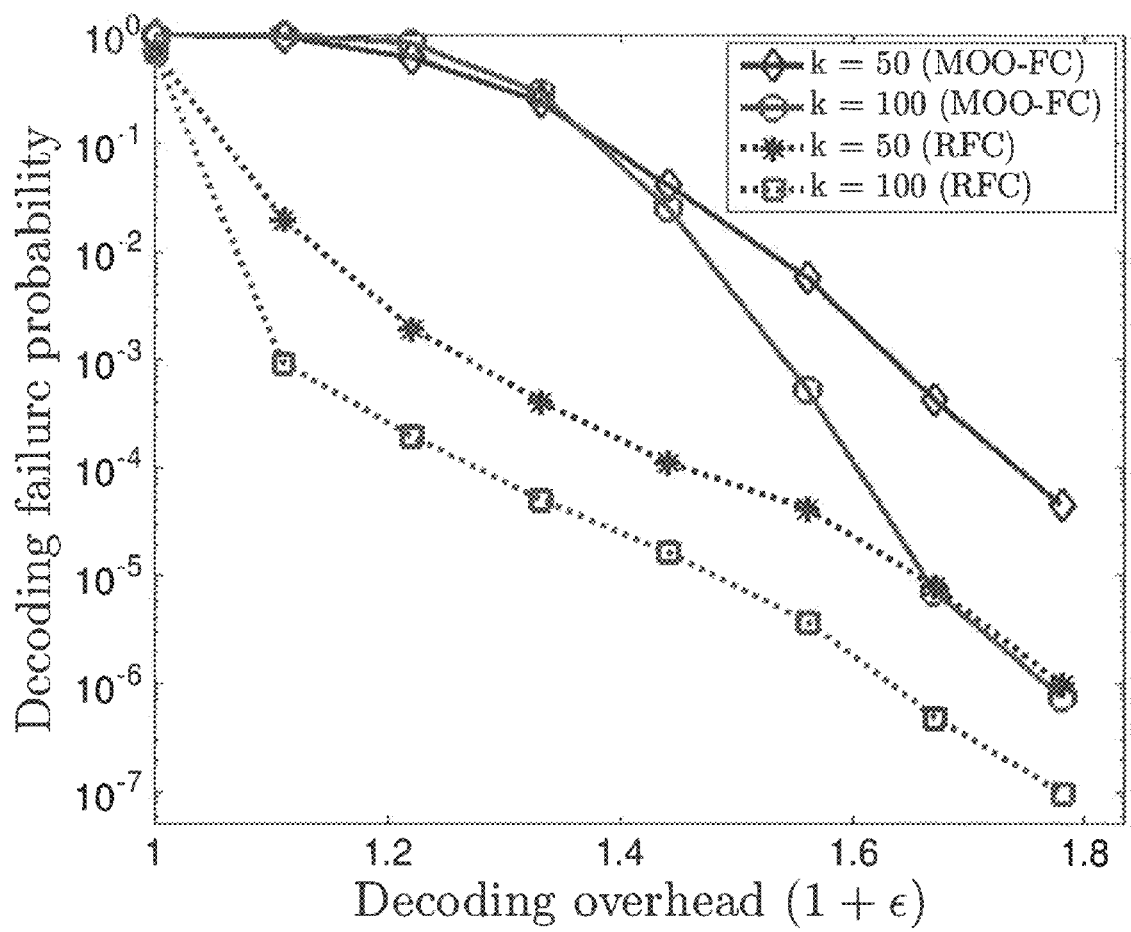
FIG. 6 is a plot of failure probability with increasing decoding overhead for k=50 and 100, for MOO-FC and RFC.

The MDS codes possess the lowest decoding overhead. In fact, 3Rep requires no decoding while the any k of n property of MDS codes guarantees an optimal k symbols suffice to recover the original data. For the Fountain code methods, the decoding overhead depends on the decoding technique employed and the level of reliability required. RFC uses the Maximum Likelihood (ML) decoding algorithm which is successful when the decoding matrix is of full rank. For MOO-FC, the Belief Propagation (BP) algorithm is used which is an implementation of the Message Passing algorithm over the BEC. FIG. 6 shows plots of decoding performance against increasing decoding overhead for k=100 over GF (2). It can be seen that for RFC, the probability of decoding failure rapidly decreases with the first 10% of overhead. The rate of decrease in the decoding failure probability decreases afterwards and a $10^{-5}$ failure probability is achieved at an overhead of approximately 55%. Asteris et al. [8] simulation results show a slightly better performance which is a reflection of the higher field size of GF ($2^8$) over which their simulation was performed. With MOO-FC, the probability of decoding failure is quite high tally until the overhead increases beyond 30%. It is seen that a failure probability of $10^{-5}$ is achieved at an overhead of approximately 70%.

8.1.4 Storage Overhead

In general, most MDS codes have a lower storage overhead as seen from the case of HDFS-14-10. By design, the locality-aware MDS codes like LRC-Xorbas and LRC-WAS have storage overheads higher than their corresponding locality-unaware MDS codes from which they were derived. For example, LRC-Xorbas stores two more symbols than HDFS-14-10. For the Fountain code based techniques like RFC and MOO-FC, there is a variable storage overhead which is sometimes higher than that of the MDS codes. The increased storage overhead is the price paid for reduced encoding node degrees and hence locality/repair cost. To lower the number of extra storage devices, the actual extra amount of data that needs to be stored for these codes can be tied to the level of reliability required. Hence setting the storage overhead to be same as the decoding overhead.

8.1.5 Reliability

Reliability refers to the capacity of a given coding technique to ensure availability of the original data when needed, given a certain failure probability of the components/drives. When a decoding operation has to be performed in order to recover the original source symbols, the system reliability is closely tied to the decoder's recovery capability. The MDS codes and RFC which are decoded using the ML decoder usually exhibit better reliability even at low decoding overhead. By increasing the average encoding node degree, the probability that decoding fails reduces. This is due to the increased likelihood of retrieving a set of output symbols which form a decoding matrix with at least k linearly independent columns. In fact, the analysis behind RFC shows that an encoding degree of $O(\log(k))$ is not only sufficient, but necessary in order to achieve a required probabilistic guarantee of recovering the source symbols from a subset of $k(1+\varepsilon)$ randomly selected symbols. At high node failure rates, MOO-FC requires greater decoding overhead than RFC to achieve same level of reliability.

TABLE 2

Performance metrics for different storage coding schemes

| Coding Scheme | Avg Repair Cost (single node) | Storage Overhead | Encoding Complexity | Decoding Complexity | Avg. Decoding Overhead |
|---|---|---|---|---|---|
| HDFS-Reed Solomon (14,10) [5] | k | 29% | $O(k^2)$ | $O(k^3)$ | 0 |
| Windows Azure Storage (10,6) [6] | 0.6k | 40% | $O(k^2)$ | $O(k^3)$ | 0 |
| HDFS-Xorbas (16,10) [5] | 0.5k | 38% | $O(k^2)$ | $O(k^3)$ | 0 |
| Repairable Fountain Codes [8] | clogk (c > 1) | ≤100% | $O(k)$ | $O(k^3)$ | 55% (k = 100) |
| MOO-FC | 5 (k = 50) 6 (k = 100) | ≤100% | $O(k)$ | $O(k \log(k))$ | 85% (k = 50) 65% (k = 100) |

8.2 Results Summary

Table 2 provides a summary of the comparison described in the previous sections. From this, benefits of the design embodiments and resulting code embodiments include:

1. MOO-FC offers an attractively low repair I/O cost among the methods considered.

2. MOO-FC achieves encoding and decoding times that scale linearly or logarithmically with the data length k. Hence it is computationally efficient for implementation.
3. MOO-FC offers systematic encoding which implies fast retrieval times in the absence of failures.
4. To achieve a data loss probability of $10^{-5}$, MOO-FC requires approximately 10-20% higher storage overhead than the other techniques.

When compared with erasure codes currently deployed in production systems [5] [6], an advantage of the embodiments is the reduced encoding and decoding complexity. Currently, the few enterprises which have deployed erasure codes do so for less-frequently accessed (cold) data and rely on three-way replication for their hot data. Coupled with its low locality and systematic form, the code construction as described herein is an attractive candidate for production systems implementation. To maximize performance and financial benefits, implementation may include: i) using the code for storage of large files (to avoid drive capacity underutilization); and ii) deploying the code in a tiered service structure to take advantage of the trade-off between storage overhead and different levels of reliability.

9. Conclusion

Described herein are fountain code constructs that solve multiple problems in distributed storage systems by providing systematic encoding, reduced repair locality, reduced encoding/decoding complexity, and enhanced reliability. Embodiments are suitable for the storage of large files and simulations show that performance is superior to existing codes with respect to implementation complexity and repair locality. The gains come at a cost of slightly higher storage overhead for a desirable level of reliability which is almost inevitable due to proven information theoretical bounds. In a system implementation, this tradeoff translates to a small increase in the use of physical hard drives (e.g., 10-20% more) than current (non-replicated) systems. However, the financial cost is not expected to be much higher than existing systems as recent statistics have shown that storage media prices are constantly decreasing. Furthermore, large-scale storage providers prefer to purchase more low-cost drives with the objective of providing reliability through a computationally efficient software protocol.

10. Appendix A—Proof of Lemma 1

Let G denote an encoding bipartite graph of k source nodes and k+N output nodes. Each non-systematic output node is of degree d with probability $\Omega_d$ and its corresponding neighbours are chosen uniformly at random. Also let $G_{NS}$ be a sub-graph of G formed by excluding just the systematic output nodes from G. Hence, $G_{NS}$ is a bipartite graph with k source and N output nodes. Upon generating N encoding symbols, for a fixed source node $u_j$ in $G_{NS}$, and a given locality value γ, define the events:

A=the event that $u_j$ is not adjacent to any encoding symbol of degree<γ;

B=the event that $u_j$ is adjacent to at least one encoding symbol of degree γ.

The probability that $u_j$ has locality γ is the joint probability $$P(A,B)=P(B|A)P(A)$$

To compute P(A), analyze the encoding process with respect to $u_j$. The probability that $u_j$ is adjacent to an encoding symbol of degree d<γ is $$\frac{1}{k}\sum_{d<\gamma}d\Omega_d$$

After N symbols are generated independently, $$P(A) = \left(1 - \frac{1}{k}\sum_{d<\gamma}d\Omega_d\right)^N$$

Similarly, the probability that $u_j$ is adjacent to a degree γ encoding symbol is given by $$\frac{\gamma\Omega_\gamma}{k}$$

After N encoding symbols have been generated, the probability that $u_j$ has no adjacent symbol of degree γ output node is given by $$\left(1 - \frac{\gamma\Omega_\gamma}{k}\right)^N$$

And consequently, $$P(B) = 1 - \left(1 - \frac{\gamma\Omega_\gamma}{k}\right)^N$$

Given that events A and B are not independent and noting that $P(B) \geq P(B|A)$, it is concluded that $$P(B,A)=P(B|A)P(A)$$

$$\leq P(B)P(A)$$

All cited publications are incorporated herein by reference in their entirety.

Equivalents

While the invention has been described with respect to illustrative embodiments thereof, it will be understood that various changes may be made to the embodiments without departing from the scope of the invention. Accordingly, the described embodiments are to be considered merely exemplary and the invention is not to be limited thereby.

REFERENCES

[1] A. Dimakis, K. Ramchandran, Y. Wu, and C. Suh, "A survey on network codes for distributed storage", Proceedings of the IEEE, vol. 99, no. 3, pp. 476-489, March 2011.

[2] P. Gopalan, C. Huang, H. Simitci, and S. Yekhanin, "On the locality of codeword symbols", Information Theory, IEEE Transactions on, vol. 58, no. 11, pp. 6925-6934, Nov 2012.

[3] M. Sathiamoorthy, M. Asteris, D. Papailiopoulos, A. G. Dimakis, R. Vadali, S. Chen, and D. Borthakur, "Xoring elephants: Novel erasure codes for big data", Proc. VLDB Endow., vol. 6, no. 5, pp. 325-336, Mar. 2013.

[4] C. Huang, H. Simitci, Y. Xu, A. Ogus, B. Calder, P. Gopalan, J. Li, and S. Yekhanin, "Erasure coding in windows azure storage", in Proc. of the 2012 USENIX Conference on Annual Technical Conference. Berkeley, Calif., USA: USENIX Association, 2012, pp. 2-2.

[5] R. Gummadi, "Coding and scheduling in networks for erasures and broadcast", Ph.D. dissertation, Univ. of Illi-

[6] M. Asteris and A. Dimakis, "Repairable fountain codes", Selected Areas in Communications, IEEE, vol. 32, no. 5, pp. 1037-1047, May 2014.

[7] M. Luby, "LT Codes", in: Foundations of Computer Science. Proceedings. The 43rd Annual IEEE Symposium on, 2002, pp. 271-280.

[8] A. Shokrollahi, "Raptor codes", Information Theory, IEEE Transactions on, vol. 52, no. 6, pp. 2551-2567, June 2006.

[9] H. Khonsari, T. Okpotse, M. Valipour, and S. Yousefi, "Analysis of ripple size evolution in the LT process", IET Communications vol. 12, no. 14, pp.1686-1693, 2018.

[10] A. Shokrollahi, Mathknow: Mathematics, Applied Sciences and Real Life. Milano: Springer Milan, 2009, ch. Theory and applications of Raptor codes, pp. 59-89. [Online]. Available: http://dx.doi.org/10.1007/978-88-470-1122-9_5

[11] T. Okpotse and S. Yousefi, "Locality-aware fountain codes for massive distributed storage systems", in: Information Theory (CWIT), 2015 IEEE 14th Canadian Workshop on, July 2015, pp. 18-21.

[12] J. Sorensen, P. Popovski, and J. Ostergaard, "Design and analysis of LT Codes with Decreasing Ripple Size", Communications, IEEE Transactions on, vol. 60, no. 11, pp. 3191-3197, Nov. 2012.

[13] B. Hughes, Random Walks and Random Environments: Random walks, ser. Oxford science publications. Clarendon Press, 1995, v. 1. [Online]. Available: https://books.google.ca/books?id=QhOen\t0LeQC

[14] N. Takama and D. P. Loucks, "Multi-level optimization for multi-objective problems", Applied Mathematical Modelling, vol. 5, no. 3, pp. 173 178, 1981. [Online]. Available: http://www.sciencedirect.com/science/article/pii/0307904X81900408

[15] A. Liau, S. Yousefi, and I.-M. Kim, "Binary Soliton-Like Rateless Coding for the Y-Network", Communications, IEEE Transactions on, vol. 59, no. 12, pp. 3217-3222, December 2011.

[16] E. Hyytia, T. Tirronen, and J. Virtamo, "Optimal degree distribution for LT Codes with Small Message Length", in IEEE INFOCOM 2007 -26th IEEE International Conference on Computer Communications, May 2007, pp. 2576-2580.

[17] R. T. Marler and J. S. Arora, "The weighted sum method for multi-objective optimization: new insights", Structural and Multidisciplinary Optimization, vol. 41, no. 6, pp. 853-862, 2010. [Online]. Available: http://dx.doi.org/10.1007/s00158-009-0460-7

The invention claimed is:

1. A method for operating a distributed digital storage system comprising at least one processor and a plurality of digital storage devices, the method comprising:
using the at least one processor to direct storing of a set of k source data symbols, wherein k is an integer greater than 1, on the plurality of digital storage devices by:
generating a plurality of encoding symbols from the set of k source data symbols using a Fountain encoder;
wherein generating the plurality of encoding symbols comprises systematic encoding via concatenation of the k source data symbols with a number of non-systematic symbols;
wherein each of the non-systematic symbols comprises a subset of d source data symbols selected uniformly at random from the set of k source data symbols and the Fountain encoded symbols are calculated as an exclusive-or combination of the uniformly selected subset of d source data symbols;
wherein a distribution for d=2,3, . . . k, comprises a multi-objective optimization performed in the following steps:
(i) determining probability of failure $P_{fail}$ of a Belief Propagation decoder;
(ii) maximizing the probability of successful decoding based on $P_{fail}$;
(iii) minimizing an average encoding/decoding complexity to obtain an objective value $f^*$.
(iv) minimizing an average repair locality subject to a constraint based on the objective value $f^*$ for an expected encoding degree $E(\Omega(d))$;
storing the plurality of encoding symbols over the plurality of digital storage devices;
wherein the steps (i)-(iv) enable:
determining a minimum repair locality within the set of the k source data symbols; and
reducing computational complexity during decoding of a random subset of the encoded symbols by using a low complexity decoder.

2. The method of claim 1, comprising a Fountain erasure encoding algorithm that uses a pre-determined distribution over an alphabet 1, . . . ,k.

3. The method of claim 2, wherein the pre-determined distribution is such that d=1 has a probability of zero, and d=2,3, . . . k, have probabilities that are determined via a numerical optimization.

4. The method of claim 2, wherein average repair locality is determined via a Fountain code locality probability function.

5. The method of claim 1 wherein a repair locality of a k source data symbol is defined as a least encoding degree of output neighbors of the k source data symbol.

6. The method of claim 1, wherein the systematic encoding yields a sparsely-connected bipartite graph.

7. The method of claim 1, where the low-complexity decoder is a Belief Propagation (BP) decoder over a binary erasure channel.

8. The method of claim 1, wherein the Fountain encoder comprises generating encoding symbols that are BP-decodable.

9. Programmed media for use with a distributed digital storage system comprising at least one processor and a plurality of digital storage devices, comprising:
a code stored on non-transitory computer readable storage media compatible with the at least one processor, the code containing instructions to direct the at least one processor to store a set of k source data symbols, wherein k is an integer greater than 1, on the plurality of digital storage devices by:
generating a plurality of encoding symbols from the set of k source data symbols using a Fountain encoder;
wherein generating the plurality of encoding symbols comprises systematic encoding via concatenation of the k source data symbols with a number of non-systematic symbols;
wherein each of the non-systematic symbols comprises a subset of d source data symbols selected uniformly at random from the set of k source data symbols and the Fountain encoded symbols are calculated as an exclusive-or combination of the uniformly selected subset of d source data symbols;

wherein a distribution for d=2,3, . . . k, comprises a multi-objective optimization performed in the following steps:
(i) determining probability of failure $P_{fail}$ of a Belief Propagation decoder;
(ii) maximizing the probability of successful decoding based on $P_{fail}$;
(iii) minimizing an average encoding/decoding complexity to obtain an objective value $f^*$.
(iv) minimizing an average repair locality subject to a constraint based on the objective value $f^*$ for an expected encoding degree $E(\Omega(d))$;
wherein the steps (i)-(iv) enable:
determining a minimum repair locality within the set of the k source data symbols; and
reducing computational complexity during decoding of a random subset of the encoded symbols by using a low complexity decoder.

10. The programmed media of claim 9, comprising a Fountain erasure encoding algorithm that uses a pre-determined distribution over an alphabet 1, . . . ,k.

11. The programmed media of claim 10, wherein the pre-determined distribution is such that d=1 has a probability of zero, and d=2,3, . . . k, have probabilities that are determined via a numerical optimization.

12. The programmed media of claim 10, wherein average repair locality is determined via a Fountain code locality probability function.

13. The programmed media of claim 9, wherein a repair locality of a source data symbol is defined as a least encoding degree of output neighbors of the source data symbol.

14. The programmed media of claim 9, wherein the systematic encoding yields a sparsely-connected bipartite graph.

15. The programmed media of claim 9, where the low-complexity decoder is a Belief Propagation (BP) decoder over a binary erasure channel.

16. The programmed media of claim 9, wherein the Fountain encoder comprises generating encoding symbols that are BP-decodable.

17. A distributed digital storage system comprising:
at least one processor;
a plurality of digital storage devices; and
the programmed non-transitory computer readable storage media of claim 9.

* * * * *